(12) United States Patent
Goto et al.

(10) Patent No.: US 12,615,030 B2
(45) Date of Patent: Apr. 28, 2026

(54) METHOD OF MAKING A MULTILAYER PIEZOELECTRIC SUBSTRATE FOR ACOUSTIC WAVE DEVICE

(71) Applicant: Skyworks Solutions, Inc., Irvine, CA (US)

(72) Inventors: Rei Goto, Osaka (JP); Keiichi Maki, Suita (JP); Gong Bin Tang, Moriguchi (JP)

(73) Assignee: Skyworks Solutions, Inc., Irvine, CA (US)

( * ) Notice: Subject to any disclaimer, the term of this patent is extended or adjusted under 35 U.S.C. 154(b) by 694 days.

(21) Appl. No.: 17/664,021

(22) Filed: May 18, 2022

(65) Prior Publication Data

US 2022/0399867 A1 Dec. 15, 2022

Related U.S. Application Data

(60) Provisional application No. 63/202,531, filed on Jun. 15, 2021, provisional application No. 63/202,532, filed on Jun. 15, 2021.

(51) Int. Cl.
| | |
|---|---|
| *H03H 9/02* | (2006.01) |
| *H03H 3/08* | (2006.01) |
| *H03H 9/145* | (2006.01) |
| *H03H 9/64* | (2006.01) |
| *H10N 30/853* | (2023.01) |

(52) U.S. Cl.
CPC .......... *H03H 9/02551* (2013.01); *H03H 3/08* (2013.01); *H03H 9/02574* (2013.01); *H03H 9/02582* (2013.01); *H03H 9/145* (2013.01);

*H03H 9/14538* (2013.01); *H03H 9/64* (2013.01); *H10N 30/8542* (2023.02)

(58) Field of Classification Search
CPC .. H03H 3/08; H03H 9/02551; H03H 9/02559; H03H 9/02574; H03H 9/02582
See application file for complete search history.

(56) References Cited

U.S. PATENT DOCUMENTS

| | | | |
|---|---|---|---|
| 9,124,240 B2 | 9/2015 | Shimizu et al. | |
| 10,749,497 B2 * | 8/2020 | Tang ......................... | H03F 3/72 |
| 12,341,487 B2 | 6/2025 | Goto et al. | |
| 2003/0234705 A1 * | 12/2003 | Abbott ................. | H03H 9/6483 |
| | | | 333/193 |
| 2009/0267447 A1 | 10/2009 | Goto et al. | |
| 2012/0044027 A1 | 2/2012 | Nakanishi et al. | |
| 2013/0026881 A1 | 1/2013 | Okamoto et al. | |
| 2019/0074819 A1 | 3/2019 | Goto et al. | |

(Continued)

*Primary Examiner* — Minh N Trinh
(74) *Attorney, Agent, or Firm* — Via LLP

(57) ABSTRACT

A method of manufacturing a surface acoustic wave resonator includes forming or providing a support substrate layer, forming or providing piezoelectric layer of lithium niobate over the support substrate layer, and forming or providing an interdigital transducer electrode including a plurality of fingers over the piezoelectric layer. The piezoelectric layer formed or provided having a cut angle (e.g., the piezoelectric angle is cut so as to have a crystal orientation) that allows the surface acoustic wave device to operate as a longitudinally leaky surface acoustic wave device that confines the acoustic wave energy within the piezoelectric substrate and that has less propagation attenuation and a higher electromechanical coupling coefficient $k^2$.

17 Claims, 13 Drawing Sheets

(56) References Cited

U.S. PATENT DOCUMENTS

| | | |
|---|---|---|
| 2019/0326879 A1 | 10/2019 | Nakamura et al. |
| 2020/0162053 A1 | 5/2020 | Goto et al. |
| 2020/0366268 A1 | 11/2020 | Goto et al. |
| 2021/0050840 A1 | 2/2021 | Goto et al. |
| 2021/0152154 A1 | 5/2021 | Tang et al. |
| 2021/0159886 A1 | 5/2021 | Goto et al. |
| 2022/0123712 A1 | 4/2022 | Tang et al. |
| 2022/0399867 A1* | 12/2022 | Goto ..................... H03H 3/08 |
| 2022/0399871 A1 | 12/2022 | Goto et al. |

* cited by examiner

METHOD OF MAKING A MULTILAYER PIEZOELECTRIC SUBSTRATE FOR ACOUSTIC WAVE DEVICE

BACKGROUND

Technical Field

Embodiments of this disclosure relate to acoustic wave devices, and more particularly to a method of making a multilayer piezoelectric substrates for acoustic wave devices.

Description of Related Technology

An acoustic wave filter can include a plurality of acoustic resonators arranged to filter a radio frequency signal. Example acoustic wave filters include surface acoustic wave (SAW) filters and bulk acoustic wave (BAW) filters. A surface acoustic wave resonator of a surface acoustic wave filter typically includes an interdigital transducer electrode on a piezoelectric substrate. A surface acoustic wave resonator is arranged to generate a surface acoustic wave.

Acoustic wave filters can be implemented in radio frequency electronic systems. For instance, filters in a radio frequency front end of a mobile phone can include acoustic wave filters. Conventional surface acoustic wave filters need thinning the pitches of the interdigital transducer electrodes for achieving a higher frequency, but there are process limitations to such thinning. Conventionally, a substrate using a longitudinally leaky SAW (LLSAW) filter may allow for higher acoustic velocity but has the drawback that the propagation attenuation of the substrate is higher

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In accordance with one aspect of the disclosure, a surface acoustic wave device is provided with a piezoelectric substrate having a cut angle (e.g., the piezoelectric angle is cut so as to have a crystal orientation) that allows the surface acoustic wave device to operate as a longitudinally leaky surface acoustic wave device that confines the acoustic wave energy within the piezoelectric substrate. The surface acoustic wave device has less propagation attenuation and a higher electromechanical coupling coefficient $k^2$.

In accordance with one aspect of the disclosure, a longitudinally leaky SAW device is provided having a multilayer substrate under the interdigital transducer including a lithium niobate piezoelectric structure (e.g., layer) underneath the interdigital transducer, and a quartz support substrate structure (e.g., layer) underneath the lithium niobate piezoelectric structure.

In accordance with one aspect of the disclosure, a longitudinally leaky SAW device is provided having a multilayer substrate under the interdigital transducer including a lithium niobate piezoelectric structure (e.g., layer) underneath the interdigital transducer, and a silicon support substrate structure (e.g., layer) underneath the lithium niobate piezoelectric structure.

In accordance with one aspect of the disclosure, a longitudinally leaky SAW device is provided having a multilayer substrate under the interdigital transducer including a lithium niobate piezoelectric structure (e.g., layer) underneath the interdigital transducer, and a diamond support substrate structure (e.g., layer) underneath the lithium niobate piezoelectric structure.

In accordance with one aspect of the disclosure, a longitudinally leaky SAW device is provided having a multilayer substrate under the interdigital transducer including a lithium niobate piezoelectric structure (e.g., layer) underneath the interdigital transducer, a silicon dioxide substrate structure (e.g., functional layer) underneath the lithium niobate piezoelectric structure, and a silicon support substrate structure (e.g., layer) underneath the silicon dioxide substrate structure.

In accordance with one aspect of the disclosure, a surface acoustic wave device is provided. The acoustic wave device comprises an interdigital transducer electrode including a plurality of fingers, a piezoelectric layer of lithium niobate disposed below the interdigital transducer electrode, and a support substrate layer disposed below the piezoelectric layer. The piezoelectric layer has a cut angle defined by first, second and third Euler angles ($\phi_1$, $\theta_1$, $\psi_1$) so that the second Euler angle $\theta_1$ has a value of about $76<\theta_1<86$ degrees.

In accordance with another aspect of the disclosure, an acoustic wave filter is provided. The acoustic wave filter comprises a surface acoustic wave resonator configured to filter a radio frequency signal. The surface acoustic wave resonator includes an interdigital transducer electrode including a plurality of fingers, a piezoelectric layer of lithium niobate disposed below the interdigital transducer electrode, and a support substrate layer disposed below the piezoelectric layer. The piezoelectric layer has a cut angle defined by first, second and third Euler angles ($\phi_1$, $\theta_1$, $\psi_1$) so that the second Euler angle $\theta_1$ has a value of about $76<\theta_1<86$ degrees.

In accordance with another aspect of the disclosure, a radio frequency module is provided. The radio frequency module comprises a package substrate, a surface acoustic wave resonator configured to filter a radio frequency signal, and additional circuitry, the surface acoustic wave resonator and additional circuitry disposed on the package substrate. The surface acoustic wave resonator includes an interdigital transducer electrode including a plurality of fingers, a piezoelectric layer of lithium niobate disposed below the interdigital transducer electrode, and a support substrate layer disposed below the piezoelectric layer. The piezoelectric layer has a cut angle defined by first, second and third Euler angles ($\phi_1$, $\theta_1$, $\psi_1$) so that the second Euler angle $\theta_1$ has a value of about $76<\theta_1<86$ degrees.

In accordance with another aspect of the disclosure, a wireless communication device is provided. The wireless communication device comprises an antenna and a front end module including one or more surface acoustic wave resonators configured to filter a radio frequency signal associated with the antenna. Each surface acoustic wave resonator includes an interdigital transducer electrode including a plurality of fingers, a piezoelectric layer of lithium niobate disposed below the interdigital transducer electrode, and a support substrate layer disposed below the piezoelectric layer. The piezoelectric layer has a cut angle defined by first, second and third Euler angles ($\phi_1$, $\theta_1$, $\psi_1$) so that the second Euler angle $\theta_1$ has a value of about $76<\theta_1<86$ degrees.

In accordance with another aspect of the disclosure, a method of manufacturing a surface acoustic wave resonator is provided. The method comprises forming or providing a support substrate layer, forming or providing piezoelectric layer of lithium niobate over the support substrate layer, and forming or providing an interdigital transducer electrode including a plurality of fingers over the piezoelectric layer. The piezoelectric layer is formed or provided having a cut angle defined by first, second and third Euler angles ($\phi_1$, $\theta_1$, $\psi_1$) so that the second Euler angle $\theta_1$ has a value of about $76 < \theta_1 < 86$ degrees.

In accordance with another aspect of the disclosure, a method of manufacturing a radio frequency module is provided. The method comprises forming or providing a package substrate, forming or providing a surface acoustic wave resonator, and mounting the surface acoustic wave resonator and additional circuitry on the package substrate. Forming or providing the surface acoustic wave resonator includes forming or providing a support substrate layer, forming or providing piezoelectric layer of lithium niobate over the support substrate layer, and forming or providing an interdigital transducer electrode including a plurality of fingers over the piezoelectric layer. The piezoelectric layer is formed or provided having a cut angle defined by first, second and third Euler angles ($\phi_1$, $\theta_1$, $\psi_1$) so that the second Euler angle $\theta_1$ has a value of about $76 < \theta_1 < 86$ degrees.

BRIEF DESCRIPTION OF THE DRAWINGS

Embodiments of this disclosure will now be described, by way of non-limiting example, with reference to the accompanying drawings.

DETAILED DESCRIPTION

Figure 1:
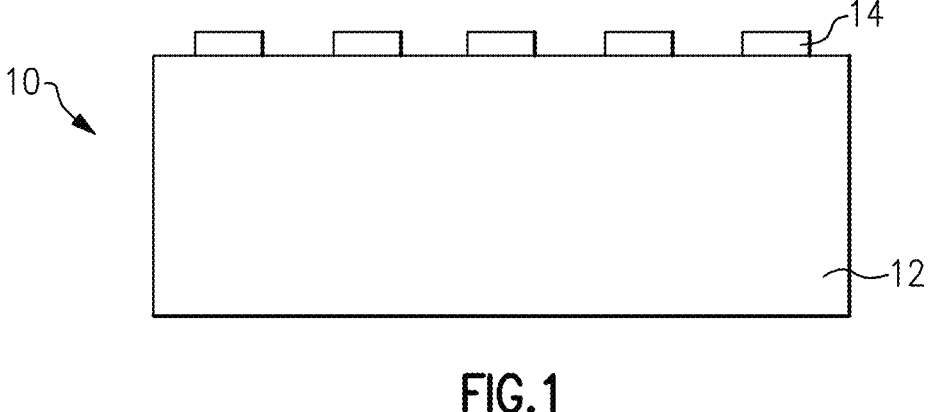
FIG. 1 is a cross sectional view of an existing surface acoustic wave device.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a cross-sectional view of an existing surface acoustic wave device 10. The surface acoustic wave device 10 includes a piezoelectric layer 12 and an IDT electrode 14. The piezoelectric layer 12 can be a lithium based piezoelectric layer. For example, the piezoelectric layer 12 can be a lithium niobate (LiNbO3) layer. As another example, the piezoelectric layer 12 can be a lithium tantalate (LiTaO3) layer. In the surface acoustic wave device 10, the IDT electrode is over the piezoelectric layer 12. The IDT electrode 14 can include molybdenum (Mo), tungsten (W), gold (Au), silver (Ag), copper (Cu), platinum (Pt), ruthenium (Ru), titanium (Ti), the like, or any suitable combination thereof.

Figure 2:
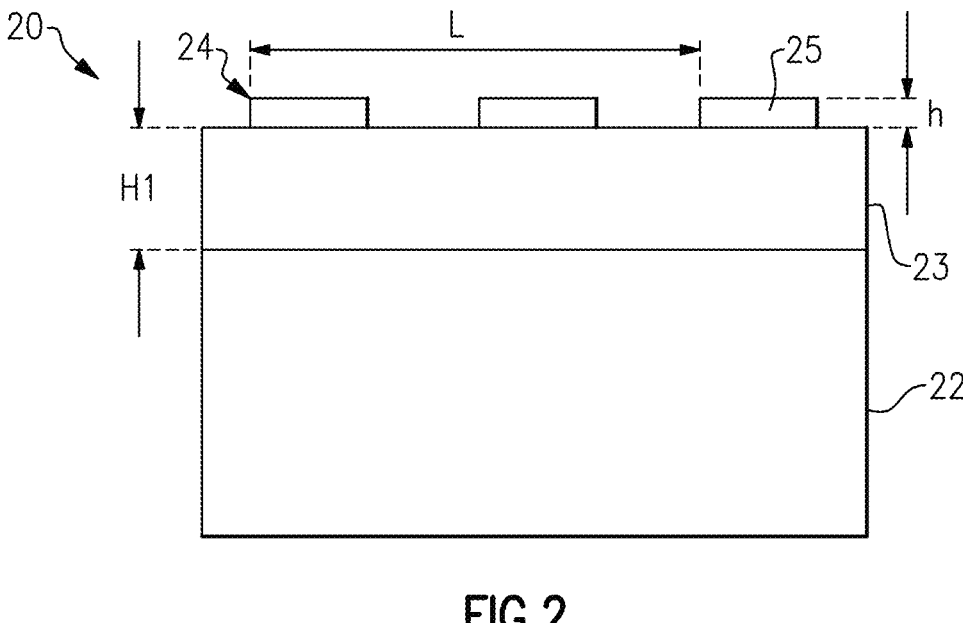
FIG. 2 is a cross-sectional view of a surface acoustic wave device according to an embodiment.

FIG. 2 shows a cross-sectional view of an embodiment of a surface acoustic wave (SAW) device 20. The SAW device 20 includes a substrate structure (e.g., layer, support substrate layer) 22, a piezoelectric structure (e.g., layer) 23 over (e.g., disposed over, disposed adjacent to, disposed in contact with) the substrate structure 22, and an interdigital transducer (IDT) electrode 24 over (e.g., disposed over, disposed adjacent to, disposed in contact with) the piezoelectric structure 23. The IDT electrode 24 can extend a height h above the piezoelectric structure 23 and have a pitch L between fingers 25 of the IDT electrode 24. The pitch L of the fingers 25 of the IDT electrode 24 corresponds to a resonant frequency of the surface acoustic wave device 20. The piezoelectric structure (e.g., layer) 23 can have a height H1 that extends between (e.g., extends from) the substrate structure (e.g., layer) 22 and the IDT electrode 24. The IDT electrode 24 can include molybdenum (Mo), tungsten (W), gold (Au), silver (Ag), copper (Cu), platinum (Pt), ruthenium (Ru), titanium (Ti), the like, or any suitable combination thereof.

In one implementation, the substrate structure (e.g., layer) 22 can be formed or provided. The piezoelectric structure (e.g., substrate, layer) 23 can be formed or provided (e.g., disposed on, attached or adhered to the substrate structure 22). The IDT electrode 24 can be formed or provided (e.g., disposed on, attached or adhered to the piezoelectric structure 23).

In one implementation, the substrate structure (e.g., layer) 22 can include (e.g., be made of, consist of) quartz. The substrate structure 22 can have a relatively high impedance. An acoustic impedance of the substrate structure 22 can be higher than an acoustic impedance of the piezoelectric structure (e.g., layer) 23. The piezoelectric structure (e.g., layer) 23 can include (e.g., be made of, consist of) lithium niobate (LiNbO3), which has a negative temperature coefficient of frequency (TCF). In one example, the pitch (e.g., wavelength) L between fingers 25 of the IDT electrode 24 can be approximately 2 um, the height h of the IDT electrode 24 can be approximately 0.08L (e.g., 0.08×the pitch L between fingers 25), such as $0.5L<H1<0.9L$, and the height H1 of the second piezoelectric structure (e.g., layer) 23 can be $0.3L<H1<0.9L$ (e.g., between about 0.3×the pitch L between fingers 25 and about 0.9×the pitch L between fingers 25), such as $0.5L<H1<0.9L$, such as 0.7L (e.g., 0.7×the pitch L between fingers 25). In other implementations, the pitch L can have other suitable values. The height h of the fingers 25 can be $0.06L<h<0.10L$ in some implementations. In one implementation, the SAW device 20 is a longitudinally leaky SAW (LLSAW) device.

The substrate structure 22 and/or the piezoelectric structure 23 can have cut angles and/or thickness that advantageously confines the acoustic wave energy within the piezoelectric structure 22 that allow for exciting the LLSAW having an acoustic velocity higher than a shear horizontal SAW (SHSAW) or Rayleigh SAW, while having a lower propagation attenuation. The SAW device 20 can then advantageously provide a high velocity, high Q resonator with high $K^2$.

In one example, the piezoelectric structure 23 can be made of lithium niobate and have a cut angle (e.g., the piezoelectric structure 23 can be cut to have a crystal orientation) defined by Euler angles ($\phi$, $\theta$, $\psi$), so that $\phi_1=0$ degrees, $\theta_1=80$ degrees and $\psi_1=90$ degrees, and the substrate structure 22 can be made of quartz and have a cut angle (e.g., the substrate structure 22 can be cut to have a crystal orientation) defined by Euler angles $\phi_2=0$ degrees, $\theta_2=62$ degrees and $\psi_2=90$ degrees. However, the piezoelectric structure 23 can have a second Euler angle of $76<\theta_1<86$ degrees and the substrate structure 22 can have a second Euler angle of $25<\theta_1<70$ degrees. In one example, the first and third Euler angles ($\phi$, $\psi$) do not change. In on implementation, the first Euler angle $\phi$ for the substrate structure 22 and the piezoelectric structure 23 can be $-15<\phi<15$ degrees. In one implementation, the second Euler angle $\psi$ for the substrate structure 22 and the piezoelectric structure 23 can be $-15<\psi<15$ degrees.

In another example, the piezoelectric structure 23 can be made of lithium niobate and the substrate structure 22 can be made of silicon. The piezoelectric structure 23 can have a cut angle (e.g., the piezoelectric structure 23 can be cut to have a crystal orientation) defined by Euler angles ($\phi$, $\theta$, $\psi$), where the second Euler angle is $76<\theta_1<86$ degrees and the height H1 of the piezoelectric structure (e.g., layer) 23 is $0.4L<H1<0.8L$, such as 0.7L. The Euler angles ($\phi$, $\theta$, $\psi$) for the piezoelectric structure 23, when made of lithium niobate, are the same as provided above, for example $\phi_1=0$, $\theta_1=80$ and $\psi_1=90$.

In another example, the piezoelectric structure 23 can be made of lithium niobate and the substrate structure 22 can be made of diamond. The height H1 of the piezoelectric structure (e.g., layer 23) is $0.7L<H1<0.9L$, such as 0.8L. The Euler angles ($\phi$, $\theta$, $\psi$) for the piezoelectric structure 23, when made of lithium niobate, are the same as provided above, for example $\phi_1=0$, $\theta_1=80$ and $\psi_1=90$.

Figure 3:
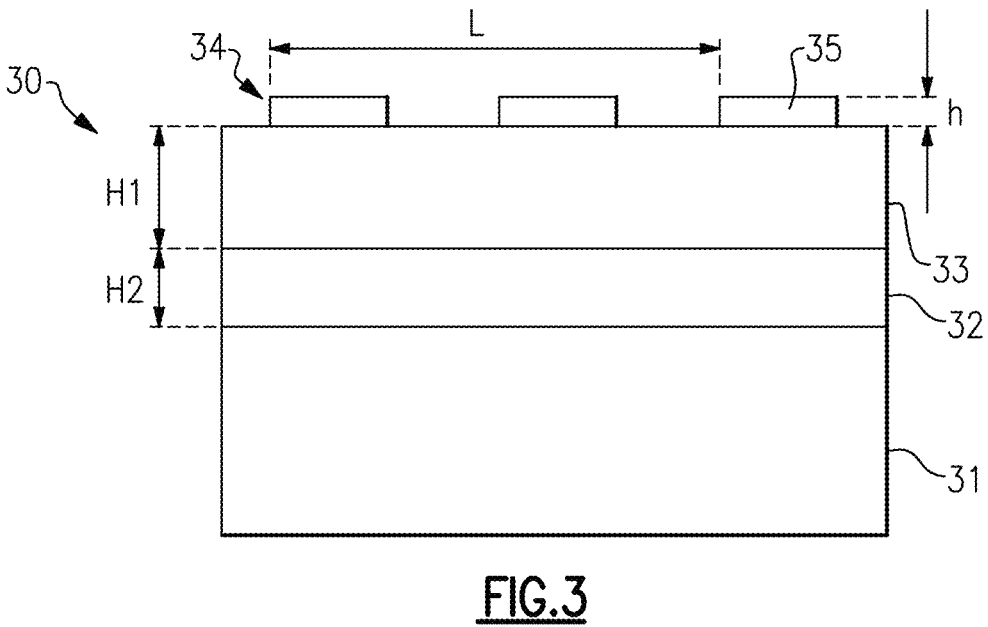
FIG. 3 is a cross-sectional view of a surface acoustic wave device according to an embodiment.

FIG. 3 shows a cross-sectional view of an embodiment of a surface acoustic wave (SAW) device 30. The SAW device 30 includes a substrate structure (e.g., substrate, layer) 31, an additional structure (e.g., substrate, functional layer) 32 over (e.g., disposed over, disposed adjacent to, disposed in contact with) the substrate structure 31, a piezoelectric structure (e.g., layer) 33 over (e.g., disposed over, disposed adjacent to, disposed in contact with) the additional structure 32, and an interdigital transducer (IDT) electrode 34 over (e.g., disposed over, disposed adjacent to, disposed in contact with) the piezoelectric structure 33. The IDT electrode 34 can extend a height h above the piezoelectric structure 33 and have a pitch L between fingers 35 of the IDT electrode 34. The pitch L of the fingers 35 of the IDT electrode 34 corresponds to a resonant frequency of the surface acoustic wave device 30. The piezoelectric structure (e.g., layer) 33 can have a height H1 that extends between (e.g., extends from) the additional structure (e.g., layer) 32 and the IDT electrode 34. The additional structure (e.g., layer) 32 can have a height H2 that extends between (e.g., extends from) the substrate structure (e.g., layer) 31 and the piezoelectric structure (e.g., layer) 33. The IDT electrode 34 can include molybdenum (Mo), tungsten (W), gold (Au), silver (Ag), copper (Cu), platinum (Pt), ruthenium (Ru), titanium (Ti), the like, or any suitable combination thereof.

In one implementation, the substrate structure (e.g., layer) 31 can be formed or provided. The additional structure (e.g., substrate, layer) 32 can be formed or provided (e.g., disposed on, attached or adhered to the substrate structure 31). The piezoelectric structure (e.g., layer) 33 can be formed or provided (e.g., disposed on, attached or adhered to the additional structure 32). The ID electrode 34 can be formed or provided (e.g., disposed on, attached or adhered to the piezoelectric structure 33).

In one implementation, the substrate structure (e.g., layer) 31 can include (e.g., be made of, consist of) silicon, the additional structure (e.g., layer) 32 can include (e.g., be made of, consist of) silicon dioxide (SiO2), and the piezoelectric structure (e.g., layer) 33 can include (e.g., be made of, consist of) lithium niobate (LiNbO3). The substrate structure 31 can have a relatively high impedance. An acoustic impedance of the substrate structure 31 can be higher than an acoustic impedance of the piezoelectric structure (e.g., layer) 33. The additional structure (e.g., layer) 32 can have a lower acoustic impedance than the substrate structure (e.g., layer) 31. The additional structure (e.g., layer) 32 can increase adhesion between the substrate structure 31 and the piezoelectric structure 33 of the multi-layer piezoelectric substrate. Alternatively or additionally, the additional structure (e.g., layer) 32 can increase heat dissipation in the SAW device 30 relative to the SAW device 20.

In one example, the pitch (e.g., wavelength) L between fingers 35 of the IDT electrode 34 can be approximately 2 um, the height h of the IDT electrode 34 can be approximately 0.8L (e.g., 0.8×the pitch L between fingers 35), the height H1 of the piezoelectric structure (e.g., layer) 33 can be 0.3L<H1<0.9L (e.g., between about 0.3×the pitch L between fingers 35 and about 0.9×the pitch L between fingers 35), such as 0.3L<H1<0.5L, and the height H2 of the additional structure (e.g., layer) 32 can be 0.3L<H2<0.7L (e.g., between about 0.3×the pitch L between fingers 35 and about 0.7×the pitch L between fingers 35), such as 0.3L<H2<0.5L. In one implementation, the SAW device 30 is a longitudinally leaky SAW (LLSAW) device.

The piezoelectric structure 33 can have cut angles and/or thickness that advantageously confines the acoustic wave energy within the piezoelectric structure 33 that allow for exciting the LLSAW having an acoustic velocity higher than a shear horizontal SAW (SHSAW) or Rayleigh SAW, while having a lower propagation attenuation. In one example, the piezoelectric structure 33 can be made of lithium niobate and have a cut angle (e.g., the piezoelectric structure 33 can be cut to have a crystal orientation) defined by Euler angles $(\phi, \theta, \psi)$, so that $\phi_1=0$ degrees, $\theta_1=80$ degrees and $\psi_1=90$ degrees.

Figure 4A:
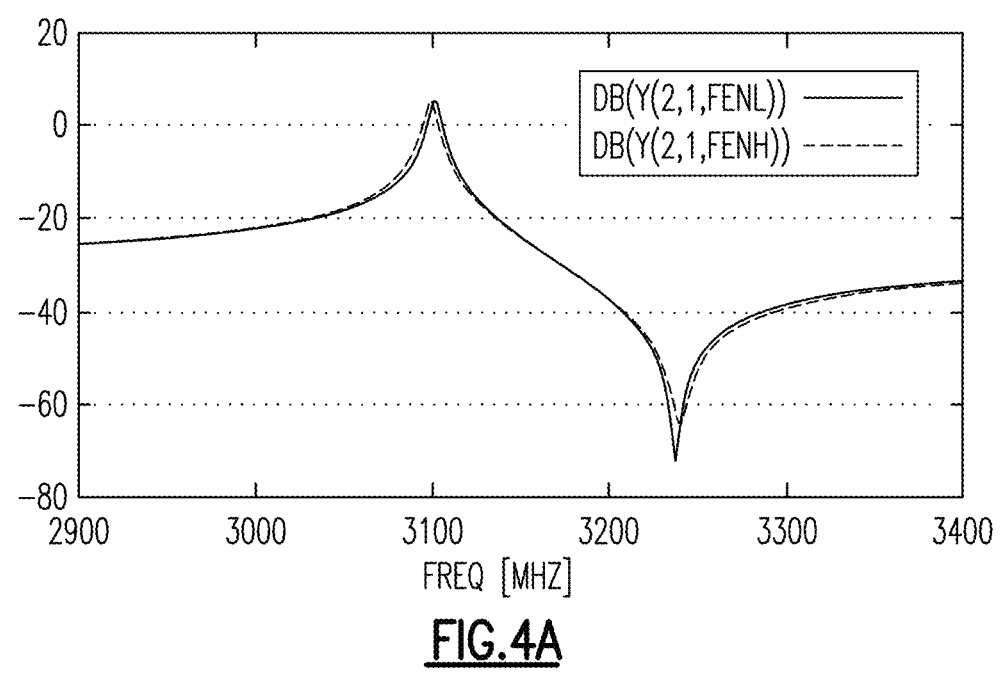
FIG. 4A is a graph of admittance versus frequency for the surface acoustic wave device of FIG. 2.
Figure 4B:
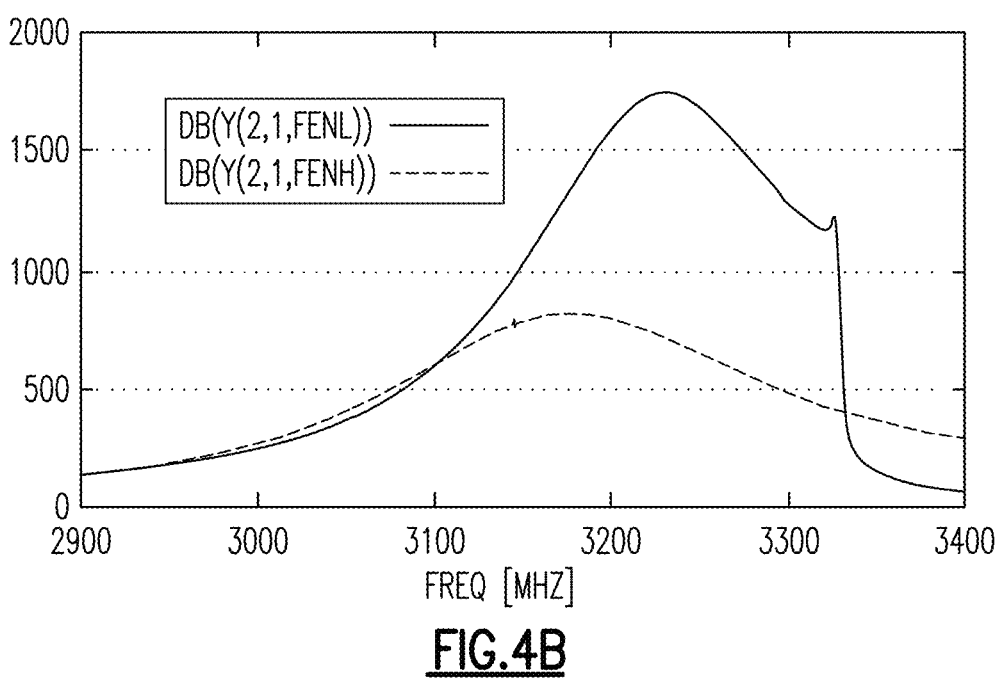
FIG. 4B is a graph of resonator quality factor Q versus frequency for the surface acoustic wave device of FIG. 2.
Figure 4C:
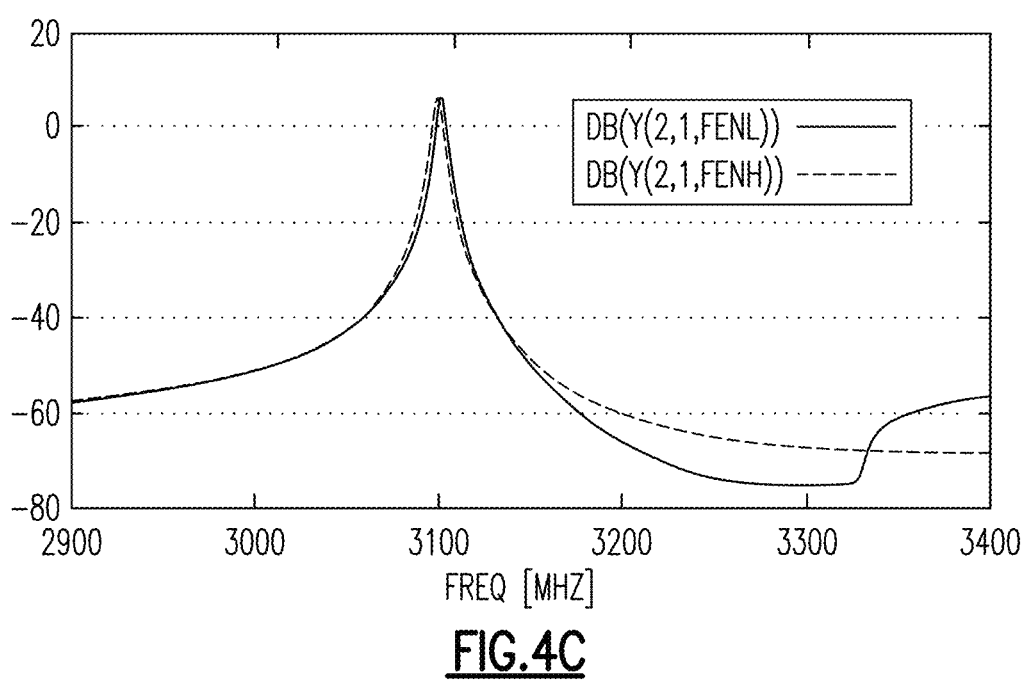
FIG. 4C is a graph of loss portion of admittance versus frequency for the surface acoustic wave device of FIG. 2.

FIGS. 4A-4C show graphs of the performance of the SAW device 20, where the piezoelectric structure 23 is of lithium niobate and has a cut angle (e.g., crystal orientation) defined by Euler angles $(\phi, \theta, \psi)$, so that $\phi_1=0$ degrees, $\theta_1=80$ degrees and $\psi_1=90$ degrees, and where the substrate structure 22 is of quartz and has a cut angle defined by Euler angles $\phi_2=0$ degrees, $\theta_2=62$ degrees and $\psi_2=90$ degrees, as compared with the SAW device 10 (e.g., baseline) where only a piezoelectric layer 12 of lithium niobate is provided below the IDT electrode 14. The Euler angles $(\phi, \theta, \psi)$ for the piezoelectric layer 12 of the SAW device 10, when made of lithium niobate, are $\phi_1=0$ degrees, $\theta_1=80$ degrees and $\psi_1=90$ degrees. The SAW device 10 can have a thickness for the piezoelectric layer 12 between 100 nm and 350 nm with a roughened bottom surface, but was modeled with an infinite thickness for the comparison in FIGS. 4A-4C, which generally corresponds with such a bottom roughened structure.

FIG. 4A is a graph of admittance versus frequency, and shows that the operating frequency is similar for the SAW device 20 as the SAW device 10. Additionally, the $k^2$ or electro-mechanical coupling coefficient is approximately the same for the SAW device 20 as the SAW device 10. FIG. 4B is a graph of resonator quality factor Q versus frequency, and shows that the SAW device 20 advantageously has a higher Q (see solid line) than the SAW device 10 (e.g., including a peak near the anti-resonant frequency of approximately 3250 MHz). FIG. 4C is a graph of loss portion of admittance versus frequency, and shows that the SAW device 20 (see solid line) advantageously has a lower loss values than the SAW device 10 (see dashed line), for example between frequencies of approximately 3150 to 3350 MHz and near the anti-resonant frequency of approximately 3250 MHz.

Figure 5A:
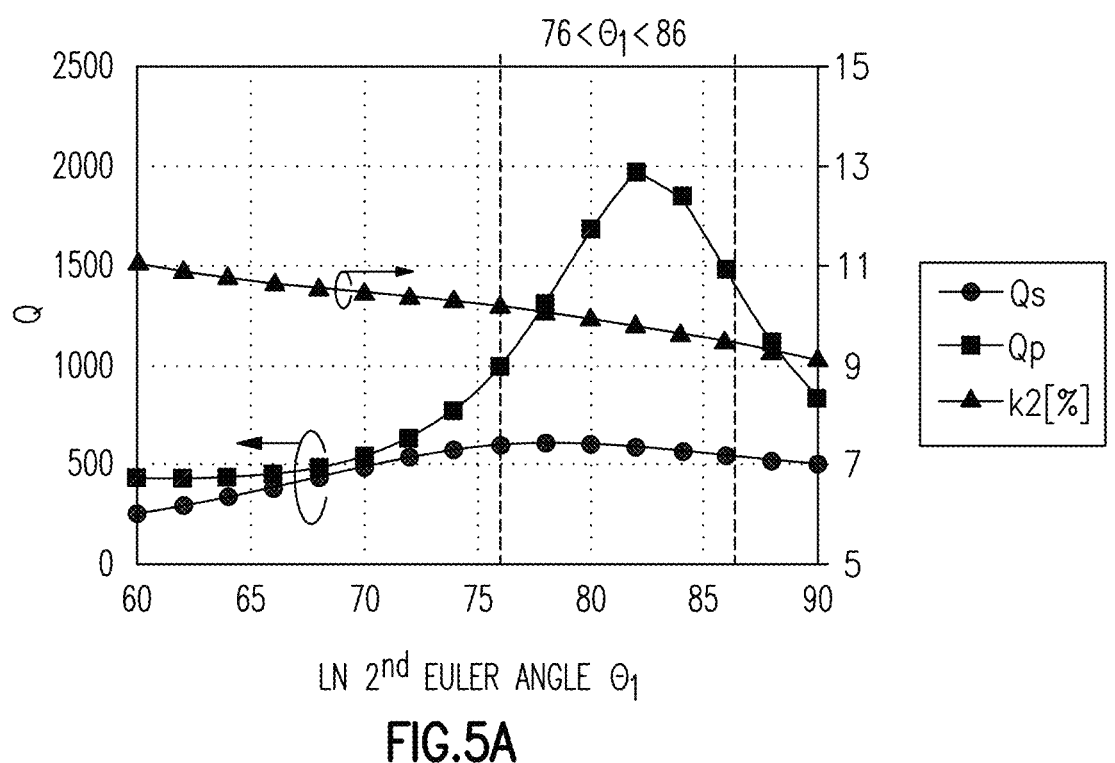
FIG. 5A is a graph of resonator quality factor Q versus lithium niobate $2^{nd}$ Euler angle sweep for the surface acoustic wave device of FIG. 2 for a quartz $3^{rd}$ Euler angle of 90 degrees.
Figure 5B:
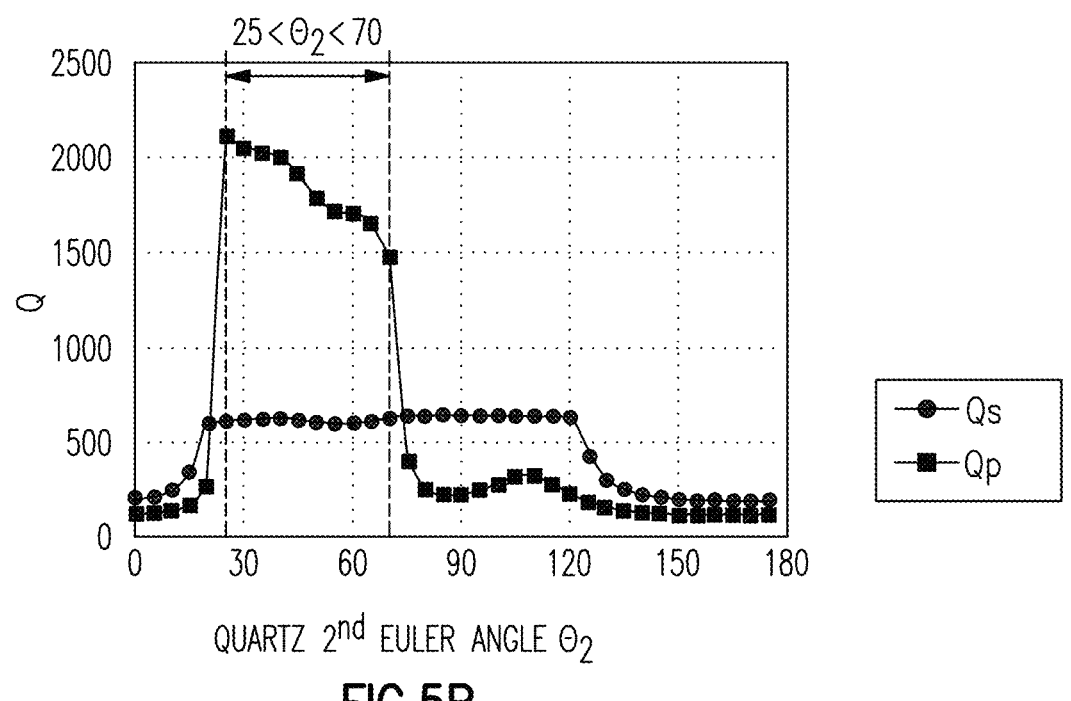
FIG. 5B is a graph of resonator quality factor Q versus quartz Euler angle sweep for the surface acoustic wave device of FIG. 2 for a quartz $3^{rd}$ Euler angle of 90 degrees.
Figure 5C:
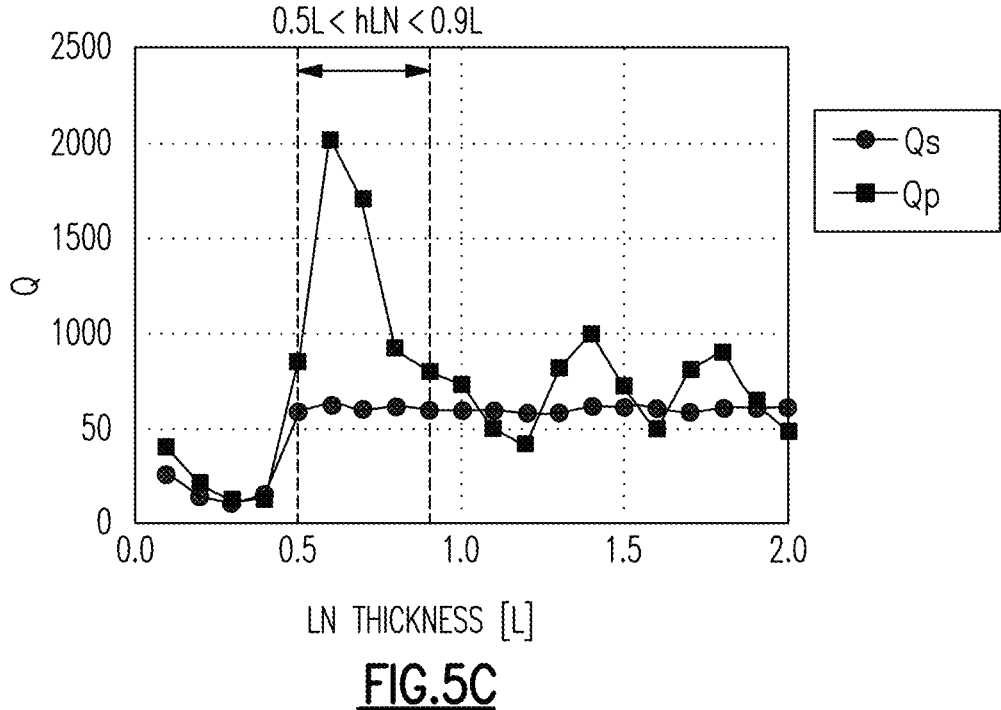
FIG. 5C is a graph of resonator quality factor Q versus lithium niobate thickness (hLN) sweep for the surface acoustic wave device of FIG. 2 for a quartz $3^{rd}$ Euler angle of 90 degrees.

FIGS. 5A-5C show graphs of parametric sweep results of the SAW device 20, where the piezoelectric structure 23 is of lithium niobate and the substrate structure 22 is of quartz, and where the quartz third Euler angle $\psi_2$ has a value of 90 degrees.

FIG. 5A shows a graph of parametric sweep results for the lithium niobate $2^{nd}$ Euler angle $\theta_1$ for the SAW device 20. The graph shows Qs or resonator quality factor Q of resonant frequency fs, Qp or resonator quality factor Q of parallel resonant frequency fp, and $k^2$ or the electro-mechanical coupling coefficient versus the lithium niobate $2^{nd}$ Euler angle $\theta_1$. The $k^2$ value determines the frequency distance between the resonant frequency (fs) and the parallel resonant frequency (fp) (e.g., anti-resonant frequency), and therefore determines the achievable bandwidth of the filter that includes the SAW device 20. As shown in FIG. 5A, a $2^{nd}$ Euler angle $\theta_1$ with a value of $76<\theta_1<86$ degrees is preferred, with a peak at approximately $\theta_1=82$ degrees, to have a high Q value.

FIG. 5B shows a graph of parametric sweep results for the quartz $2^{nd}$ Euler angle $\theta_2$ for the SAW device 20. The graph shows Qs or resonator quality factor Q of resonant frequency fs and Qp or resonator quality factor Q of parallel resonant frequency fp versus the quartz $2^{nd}$ Euler angle $\theta_2$. As shown in FIG. 5B, a $2^{nd}$ Euler angle $\theta_2$ with a value of $25<\theta_2<70$ degrees is preferred, with a peak at approximately $\theta_2=25$ degrees, to have a high Q value.

FIG. 5C shows a graph of parametric sweep results for the lithium niobate thickness H1 for the SAW device 20. The graph shows Qs or resonator quality factor Q of resonant frequency fs and Qp or resonator quality factor Q of parallel resonant frequency fp versus lithium niobate thickness H1 (e.g., hLN) as a function of the pitch L (e.g., wavelength) between the fingers 25 of the IDT electrode 24. As shown in FIG. 5C, a thickness H1 (e.g., hLN) for lithium niobate (e.g., of the piezoelectric structure 23) with a value of 0.5L<H1<0.9L (e.g., 0.5L<hLN<0.9L) is preferred, with a peak at approximately H1=0.7L, to have a high Q value.

Figure 6A:
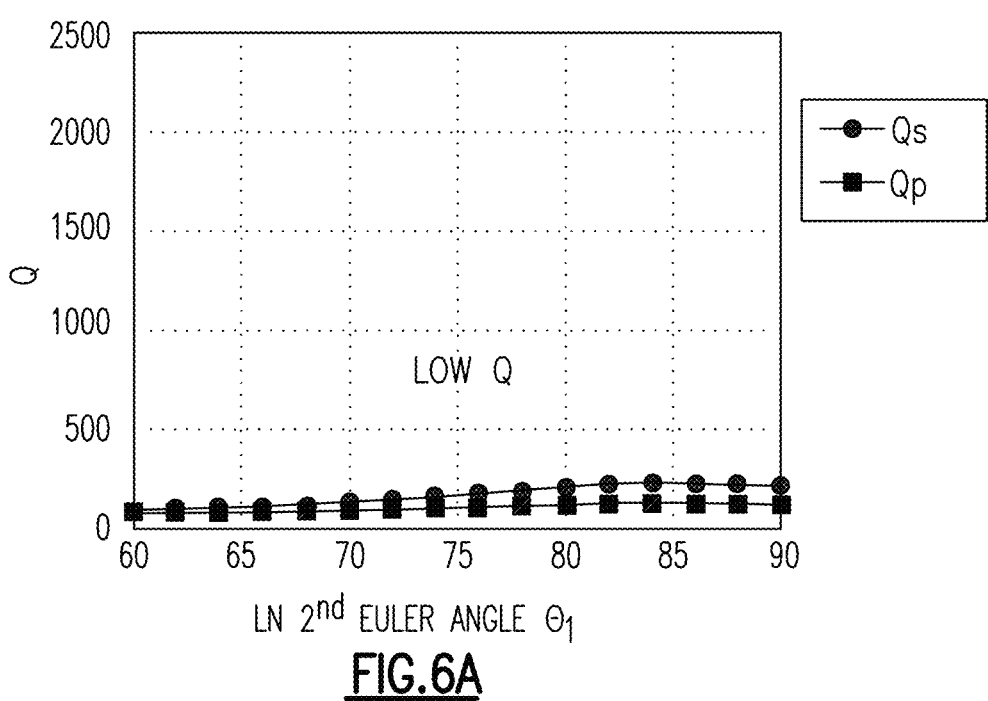
FIG. 6A is a graph of resonator quality factor Q versus lithium niobate $2^{nd}$ Euler angle sweep for the surface acoustic wave device of FIG. 2 for a quartz $3^{rd}$ Euler angle of 0 degrees.
Figure 6B:
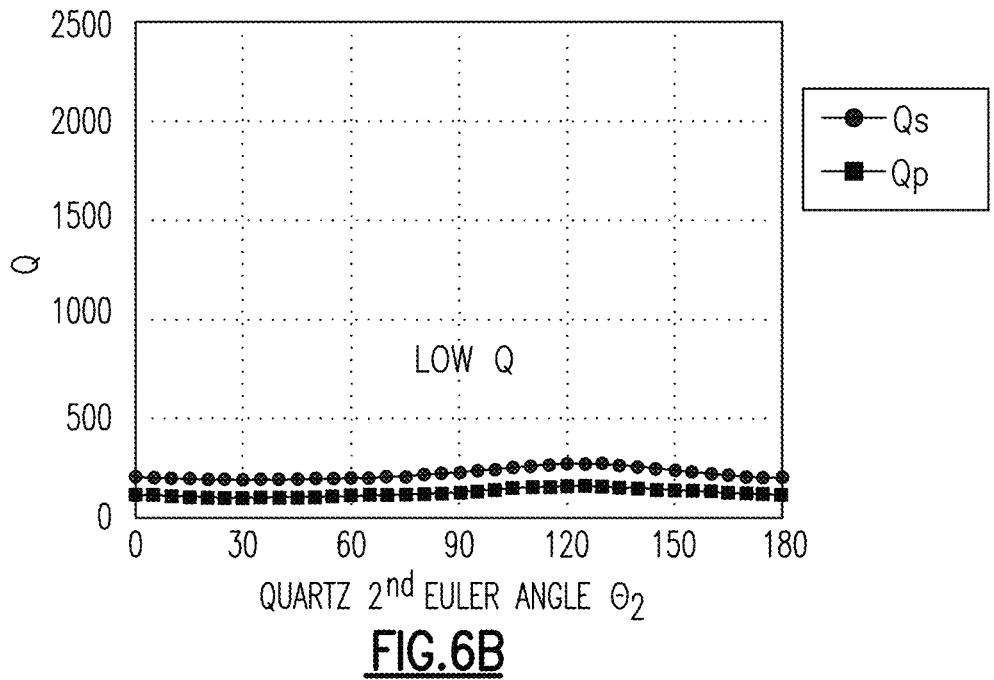
FIG. 6B is a graph of resonator quality factor Q versus quartz Euler angle sweep for the surface acoustic wave device of FIG. 2 for a quartz $3^{rd}$ Euler angle of 0 degrees.
Figure 6C:
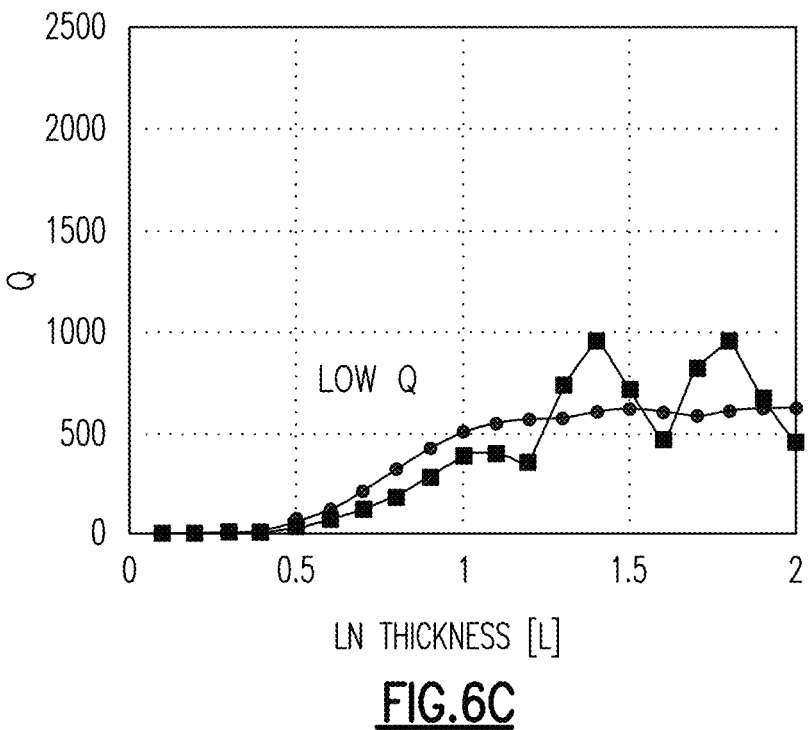
FIG. 6C is a graph of resonator quality factor Q versus lithium niobate thickness (hLN) sweep for the surface acoustic wave device of FIG. 2 for a quartz $3^{rd}$ Euler angle of 0 degrees.

FIGS. 6A-6C show graphs of parametric sweep results of the SAW device 20, where the piezoelectric structure 23 is of lithium niobate and the substrate structure 22 is of quartz, and where the quartz third Euler angle $\psi_2$ has a value of 0 degrees. FIG. 6A shows a graph of parametric sweep results for the lithium niobate $2^{nd}$ Euler angle $\theta_1$ for the SAW device 20. The graph shows Qs or resonator quality factor Q of resonant frequency fs, and Qp or resonator quality factor Q of parallel resonant frequency fp. As shown in FIG. 6A, both Qp and Qs remain low across a range of $2^{nd}$ Euler angle $\theta_1$ with a value of $65<\theta_1<90$. FIG. 6B shows a graph of parametric sweep results for the quartz $2^{nd}$ Euler angle $\theta_2$ for the SAW device 20. The graph shows Qs or resonator quality factor Q of resonant frequency fs and Qp or resonator quality factor Q of parallel resonant frequency fp versus the quartz $2^{nd}$ Euler angle $\theta_2$. As shown in FIG. 6B, both Qp and Qs remain low across arrange of $2^{nd}$ Euler angle $\theta_2$ with a value of $0<\theta_2<180$. FIG. 6C shows a graph of parametric sweep results for the lithium niobate thickness H1 (e.g., hLN) for the SAW device 20. The graph shows Qs or resonator quality factor Q of resonant frequency fs and Qp or resonator quality factor Q of parallel resonant frequency fp versus lithium niobate thickness H1 (e.g., hLN) as a function of the pitch L (e.g., wavelength) between the fingers 25 of the IDT electrode 24. As shown in FIG. 6C, Qs and Qp remain low across a range of thickness H1 (e.g., hLN) for lithium niobate (e.g., of the second piezoelectric structure 23) having a value of 0<H1<2.0L. Therefore, a quartz third Euler angle $\psi_2$ of 0 degrees results in a low Q value and is not preferred.

Figure 7A:
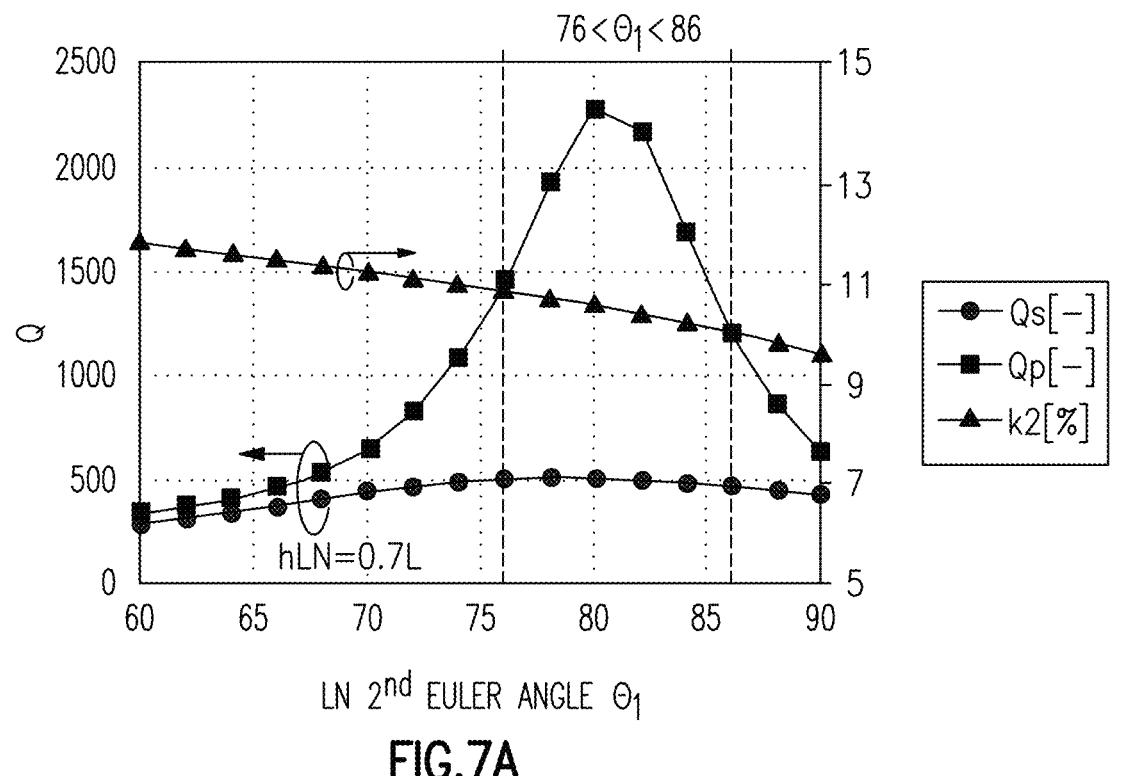
FIG. 7A is a graph of resonator quality factor Q versus lithium niobate Euler angle sweep for the surface acoustic wave device of FIG. 2.
Figure 7B:
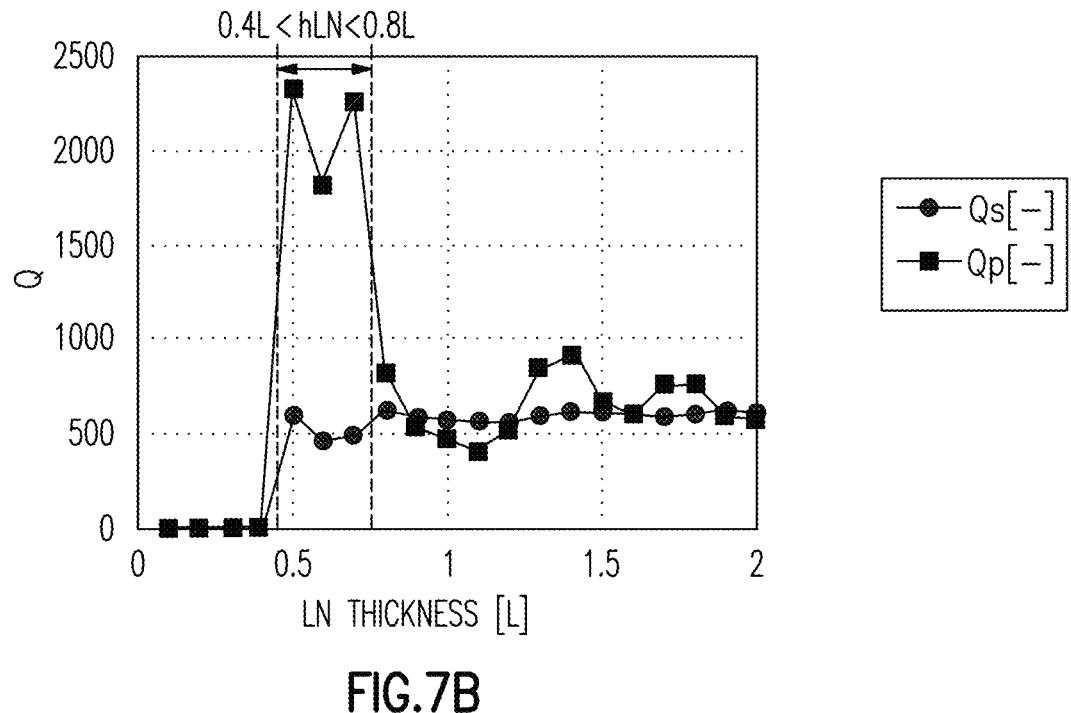
FIG. 7B is a graph of resonator quality factor Q versus lithium niobate thickness (hLN) sweep for the surface acoustic wave device of FIG. 2.

FIGS. 7A-7B show graphs of parametric sweep results of the SAW device 20, where the piezoelectric structure 23 is of lithium niobate and the substrate structure 22 is of silicon.

FIG. 7A shows a graph of parametric sweep results for the lithium niobate $2^{nd}$ Euler angle $\theta_1$ for the SAW device 20. The graph shows Qs or resonator quality factor Q of resonant frequency fs, Qp or resonator quality factor Q of parallel resonant frequency fp, and $k^2$ or the electro-mechanical coupling coefficient versus the lithium niobate $2^{nd}$ Euler angle $\theta_1$. The $k^2$ value determines the frequency distance between the resonant frequency (fs) and the parallel resonant frequency (fp) (e.g., anti-resonant frequency), and therefore determines the achievable bandwidth of the filter that includes the SAW device 20. As shown in FIG. 7A, a $2^{nd}$ Euler angle $\theta_1$ with a value of 76<$\theta_1$<86 degrees is preferred, with a peak at approximately $\theta_1$=80 degrees, to have a high Q value.

FIG. 7B shows a graph of parametric sweep results for the lithium niobate thickness H1 (e.g., hLN) for the SAW device 20. The graph shows Qs or resonator quality factor Q of resonant frequency fs and Qp or resonator quality factor Q of parallel resonant frequency fp versus lithium niobate thickness H1 (e.g., hLN) as a function of the pitch L (e.g., wavelength) between the fingers 25 of the IDT electrode 24. As shown in FIG. 7B, a thickness H1 (e.g., hLN) for lithium niobate (e.g., of the piezoelectric structure 23) with a value of 0.4L<H1<0.8L (e.g., 0.4L<hLN<0.8L) is preferred, such as H1=0.7L (e.g., hLN=0.7L), to have a high Q value.

Figure 8A:
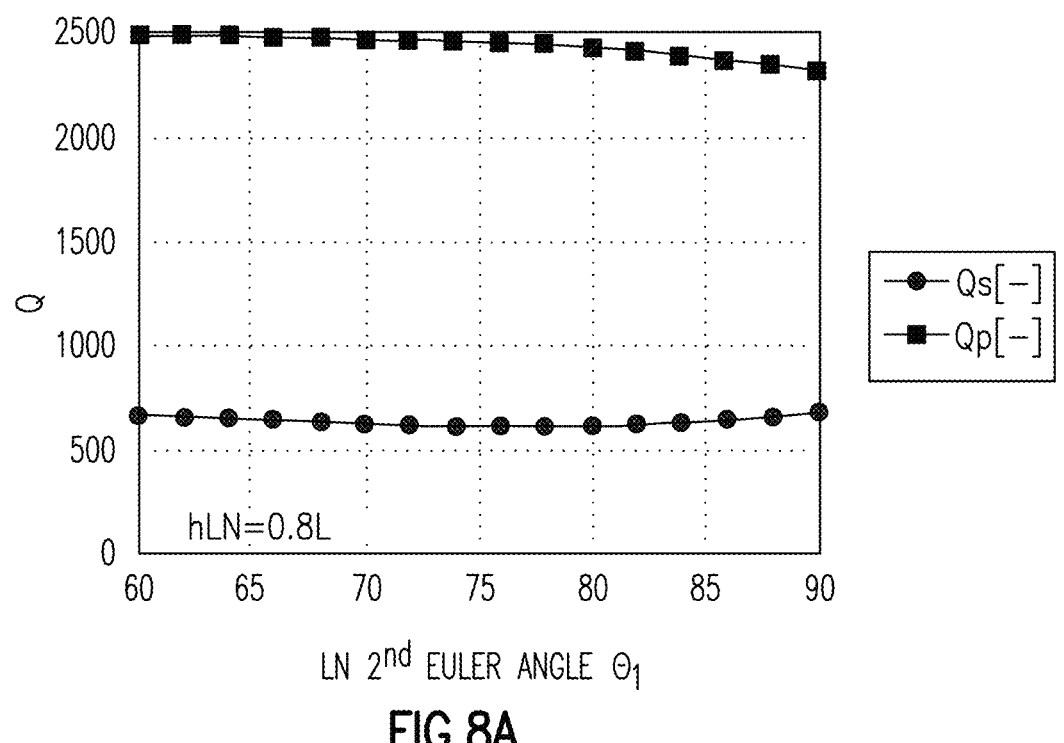
FIG. 8A is a graph of resonator quality factor Q versus lithium niobate Euler angle sweep for the surface acoustic wave device of FIG. 2.
Figure 8B:
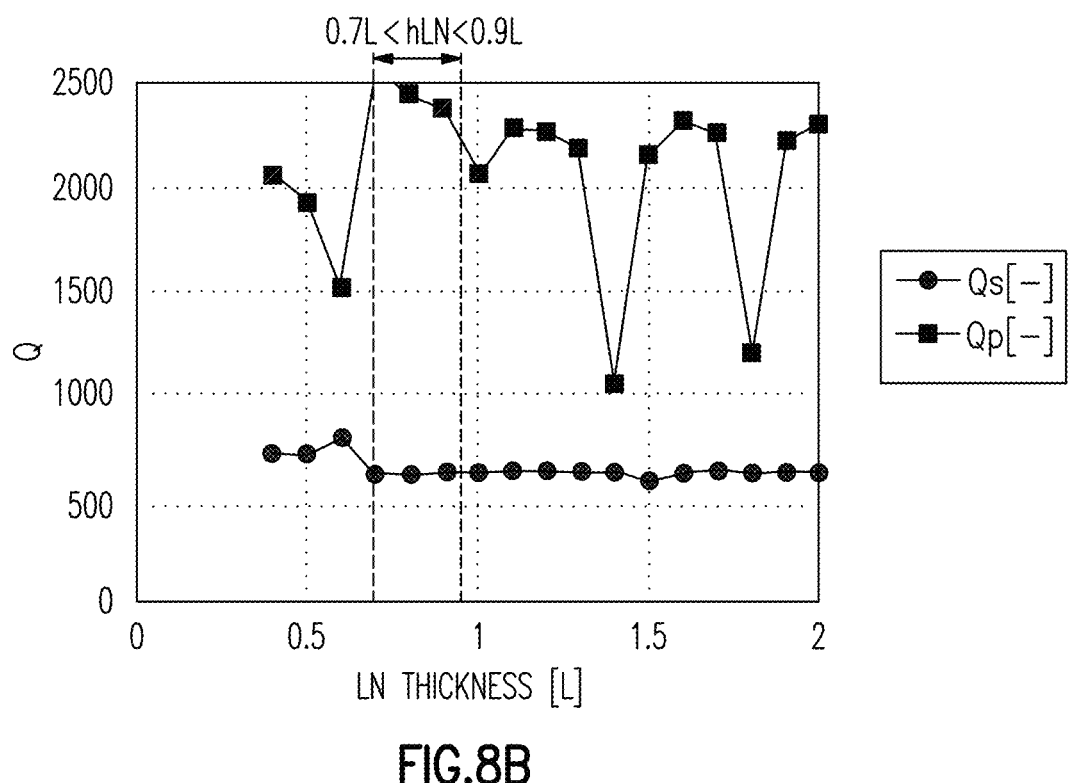
FIG. 8B is a graph of resonator quality factor Q versus lithium niobate thickness (hLN) sweep for the surface acoustic wave device of FIG. 2.

FIGS. 8A-8B show graphs of parametric sweep results of the SAW device 20, where the piezoelectric structure 23 is of lithium niobate and the substrate structure 22 is of diamond.

FIG. 8A shows a graph of parametric sweep results for the lithium niobate $2^{nd}$ Euler angle $\theta_1$ for the SAW device 20. The graph shows Qs or resonator quality factor Q of resonant frequency fs, and Qp or resonator quality factor Q of parallel resonant frequency fp versus the lithium niobate $2^{nd}$ Euler angle $\theta_1$. As shown in FIG. 8A, the Qp and Qs values do not change significantly across a $2^{nd}$ Euler angle $\theta_1$ range of 60<$\theta_1$<90 degrees and Qp remains high across the entire range.

FIG. 7B shows a graph of parametric sweep results for the lithium niobate thickness H1 (e.g., hLN) for the SAW device 20. The graph shows Qs or resonator quality factor Q of resonant frequency fs and Qp or resonator quality factor Q of parallel resonant frequency fp versus lithium niobate thickness H1 (e.g., hLN) as a function of the pitch L (e.g., wavelength) between the fingers 25 of the IDT electrode 24. As shown in FIG. 8B, a thickness H1 (e.g., hLN) for lithium niobate (e.g., of the piezoelectric structure 23) with a value of 0.7L<H1<0.9L (e.g., 0.7L<hLN<0.9L) is preferred, such as H1=0.8L (hLN=0.8L), to have a high Q value.

Figure 9A:
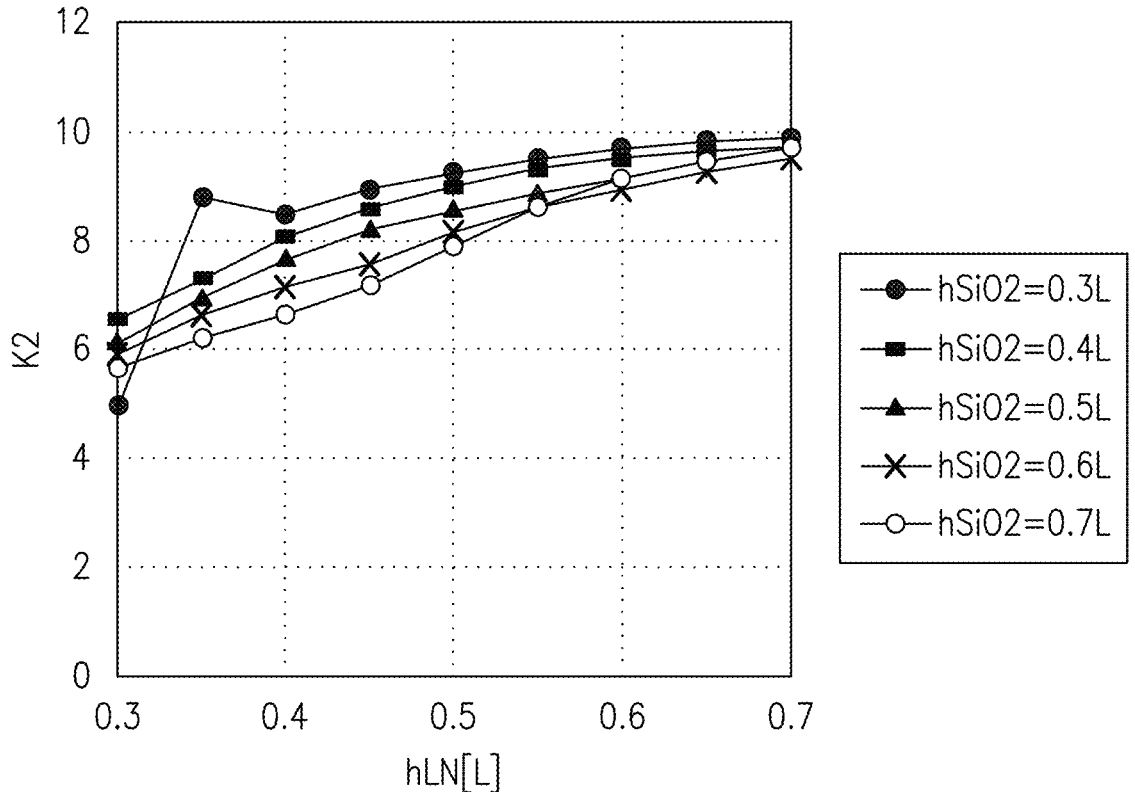
FIG. 9A is a graph of K2 versus lithium niobate thickness (hLN) for different thicknesses of SiO2 (hSiO2) for the surface acoustic wave device of FIG. 3.
Figure 9B:
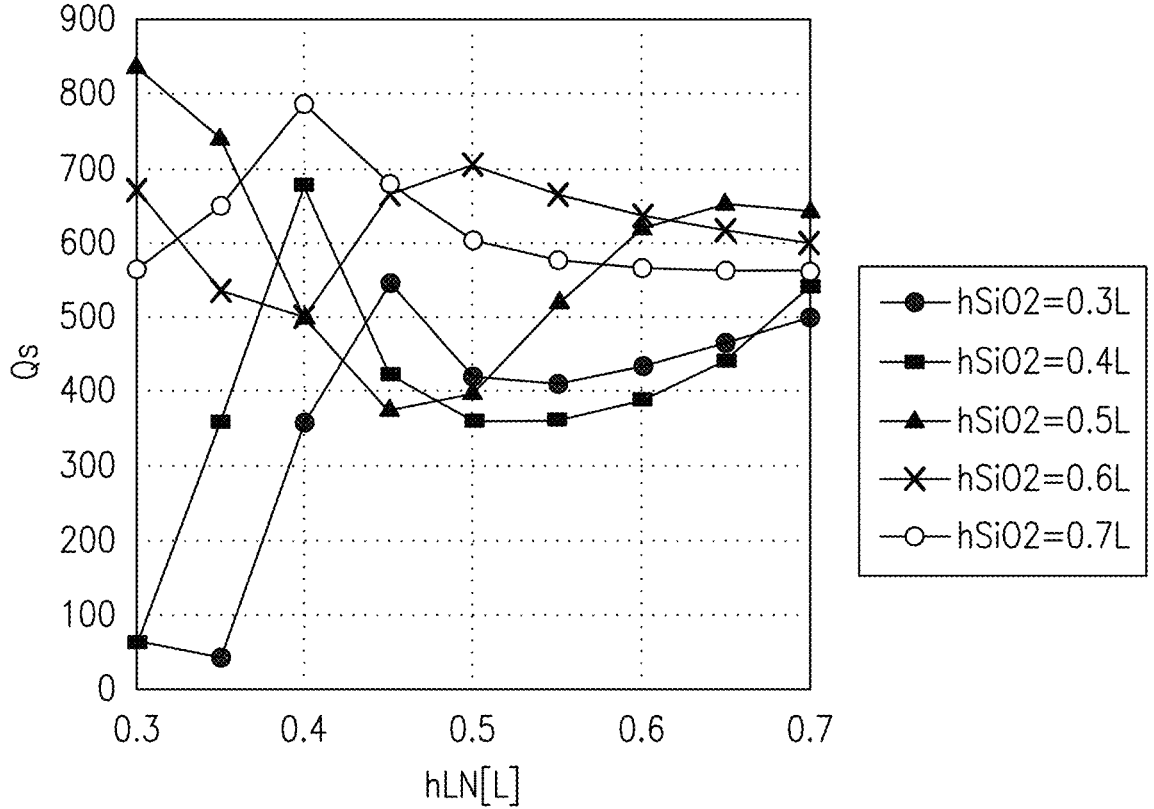
FIG. 9B is a graph of resonator quality factor for resonant frequency (Qs) versus lithium niobate thickness (hLN) for different thicknesses of SiO2 (hSiO2) for the surface acoustic wave device of FIG. 3.
Figure 9C:
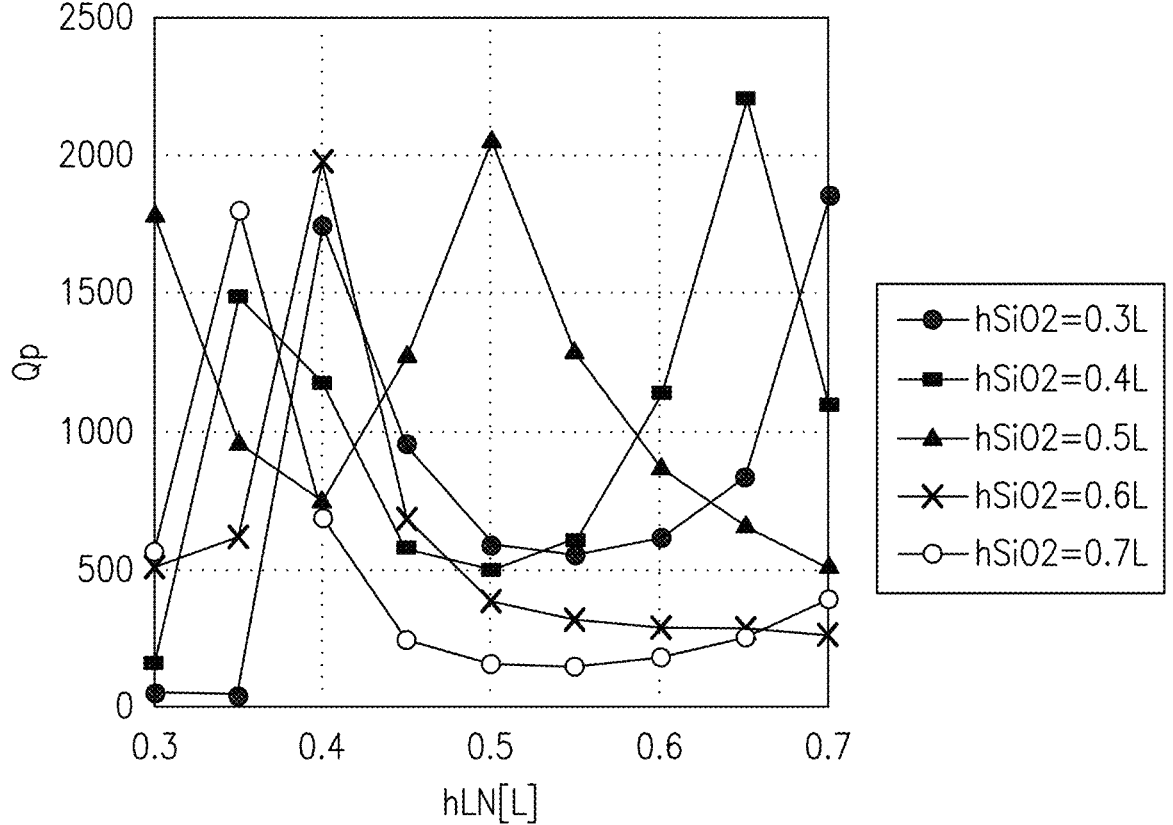
FIG. 9C is a graph of resonator quality factor for anti-resonant frequency (Qp) versus lithium niobate thickness (hLN) for different thicknesses of SiO2 (hSiO2) for the surface acoustic wave device of FIG. 3.

FIGS. 9A-9C show graphs of parametric sweep results of the SAW device 30, where the substrate structure 31 is silicon, the additional structure (e.g., functional layer) 32 is silicon dioxide (SiO2) and the piezoelectric structure 33 is lithium niobate. Graphs are provided for different values of lithium niobate thickness (e.g., H1 or hLN) as a function of the pitch L of the fingers 35 of the IDT electrode 34 (e.g., H1 or hLN equal to 0.3L, 0.4L, 0.5L, 0.6L and 0.7L). FIG. 9A is a graph of $K^2$ versus lithium niobate thickness (e.g., H1 or hLN). FIG. 9B is a graph of resonator quality factor for resonant frequency (Qs) versus lithium niobate thickness (e.g., H1 or hLN). FIG. 9C is a graph of resonator quality factor for anti-resonant frequency (Qp) versus lithium niobate thickness (e.g., H1 or hLN). As shown in FIG. 9C, for a thickness H2 or hSiO2 of 0.3L for the additional structure (e.g., functional layer) 32, the thickness H1 (e.g., of lithium niobate or hLN) for the piezoelectric structure 33 is preferred to have a value between 0.35L and 0.45L or between 0.55L and 0.7L to have a high Qp. For a thickness H2 or hSiO2 of 0.4L for the additional structure (e.g., functional layer) 32, the thickness H1 (e.g., of lithium niobate or hLN) for the piezoelectric structure 33 is preferred to have a value between 0.30L and 0.45L or between 0.60L and 0.7L to have a high Qp. For a thickness H2 or hSiO2 of 0.5L for the additional structure (e.g., functional layer) 32, the thickness H1 (e.g., of lithium niobate or hLN) for the piezoelectric structure 33 is preferred to have a value between 0.30L and 0.35L or between 0.45L and 0.55L to have a high Qp. For a thickness H2 or hSiO2 of 0.6L for the additional structure (e.g., functional layer) 32, the thickness H1 (e.g., of lithium niobate or hLN) for the piezoelectric structure 33 is preferred to have a value between 0.35L and 0.45L to have a high Qp. For a thickness H2 or hSiO2 of 0.7L for the additional structure (e.g., functional layer) 32, the thickness H1 (e.g., of lithium niobate or hLN) for the piezoelectric structure 33 is preferred to have a value between 0.30L and 0.40L to have a high Qp. Additionally, the additional structure 32 of silicon dioxide (SiO2) between the substrate structure 31 of silicon and the piezoelectric structure (e.g., layer) 33 of lithium niobate provides an improvement in TCF (e.g., the negative TCF decreases toward zero).

The surface acoustic wave device 20, 30 and/or other acoustic wave devices disclosed herein can be included in a band pass filter. The band pass filter can have a passband with a center frequency in a range from 1.5 gigahertz (GHz) to 2.5 GHz. The center frequency can be an arithmetic mean or a geometric mean of a lower cutoff frequency of the passband and an upper cutoff frequency of the passband. The center frequency in a range from 1.5 GHz to 2.2 GHz in certain instances. The passband can have a bandwidth in a range from 5 megahertz (MHz) to 100 MHz in certain applications. The band pass filter can have a passband defined by a communication standard in which the passband is within a frequency range from 1.5 GHz to 2.5 GHz.

In some instances, the surface acoustic wave device 20, 30 and/or other acoustic wave devices disclosed herein can be included in a band stop filter having a center frequency in a range from 1.5 GHz to 2.5 GHz. The stop band of the band stop filter can have a bandwidth in a range from 5 MHz to 100 MHz in certain applications.

According to some other embodiments (not illustrated), a multi-layer IDT electrode in accordance with any suitable principles and advantages disclosed herein can be implemented in a boundary wave resonator. Any of the principles and advantages disclosed herein can be implemented in any suitable acoustic wave resonator that includes an IDT electrode.

The acoustic wave devices disclosed herein can be implemented in a variety of packaged modules. An example packaged module will now be described in which any suitable principles and advantages of the acoustic wave resonators disclosed herein can be implemented. A packaged module can include one or more features of the packaged module of FIG. 10 and/or the packaged module of FIG. 11.

Figure 10:
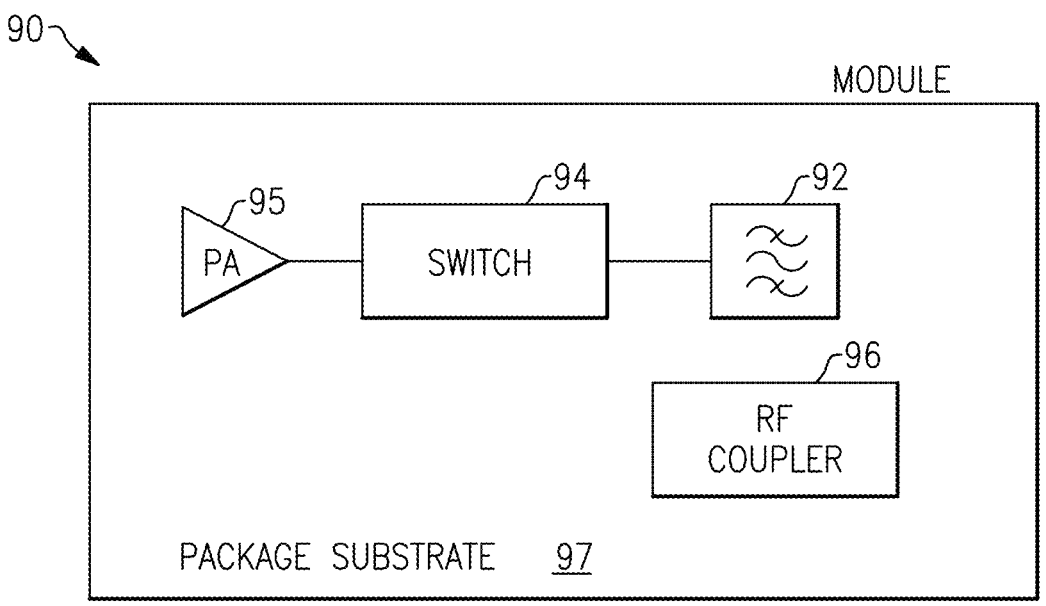
FIG. 10 is a schematic block diagram of a packaged module that includes a filter with an acoustic wave device according to an embodiment.

FIG. 10 is a schematic block diagram of a module 90 that includes a filter 92 with an acoustic wave device in accordance with any suitable principles and advantage disclosed herein. The module 90 includes the filter 92 that includes an acoustic wave device, a switch 94, a power amplifier 95, and a radio frequency (RF) coupler 96. The power amplifier 95 can amplify a radio frequency signal. The switch 94 can selectively electrically couple an output of the power amplifier 95 to the filter 92. The filter 92 can be a band pass filter. The filter 92 can be included in a duplexer or other multiplexer. The RF coupler 96 can be a directional coupler or any other suitable RF coupler. The RF coupler 96 can sample a portion of RF power in a transmit signal path and provide an indication of the RF power. The RF coupler 96 can be coupled to the transmit signal path in any suitable point, such as between an output of the power amplifier 95 and an input to the switch 94. The module 90 can include a package that encloses the illustrated elements. The filter 92 with the acoustic wave resonator can be disposed on a common packaging substrate 97 with the other illustrated elements of the module 90. The packaging substrate 97 can be a laminate substrate, for example.

Figure 11:
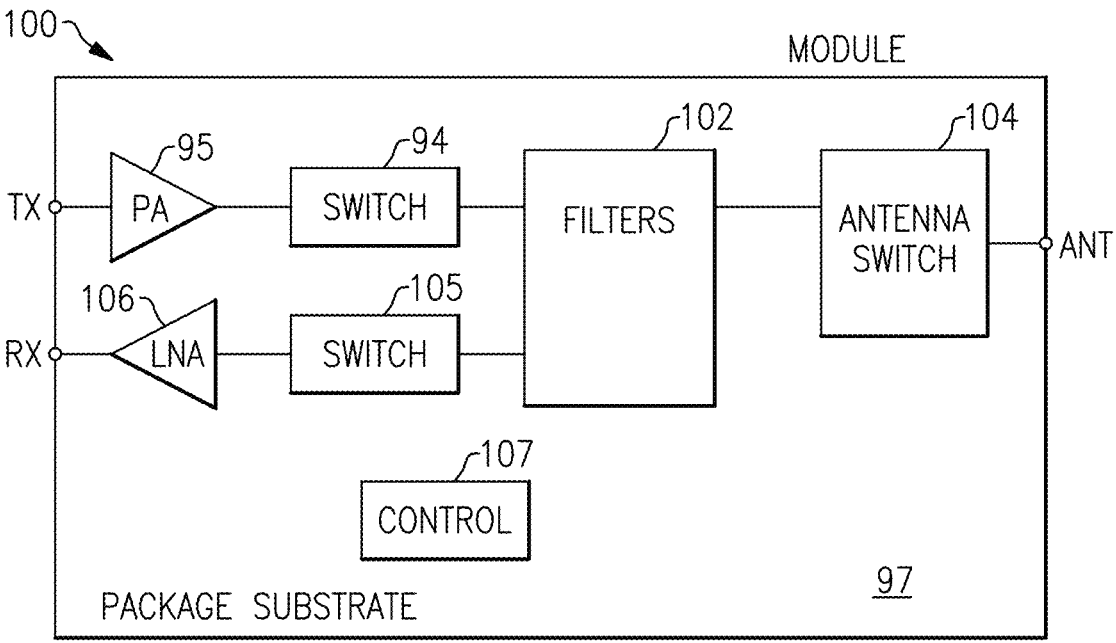
FIG. 11 is a schematic block diagram of a packaged module that includes a filter with an acoustic wave device according to another embodiment.

FIG. 11 is a schematic block diagram of a module 100 that includes filters 102 that include one or more acoustic wave devices in accordance with any suitable principles and advantage disclosed herein. As illustrated, the module 100 includes a power amplifier 95, a switch 94, filters 102, an antenna switch 104, a switch 105, a low noise amplifier 106, and a control circuit 107.

The power amplifier 95 can receive a radio frequency signal from a transmit port TX. In some instances, a switch can electrically connect a selected one of a plurality of transmit ports to an input of the power amplifier 95. The power amplifier 95 can operate in an envelope tracking mode and/or an average power tracking mode. The switch 94 can be a multi-throw radio frequency switch configured to electrically connect an output of the power amplifier 95 to one or more selected transmit filters of the filters 102. The switch 94 can be a band select switch arranged to electrically connect the output of the power amplifier 95 to a transmit filter for a particular frequency band.

The filters 102 can be acoustic wave filters. One or more resonators in any of the filters 102 can include a multi-layer IDT electrode in accordance with any suitable principles and advantages disclosed herein. In certain applications, all acoustic resonators of one or more filters of the filters 102 include a multi-layer IDT electrode in accordance with any suitable principles and advantages disclosed herein. The filters 102 can include a plurality of duplexers and/or other multiplexers. Alternatively or additionally, the filters 102 can include one or more standalone transmit filters and/or one or more standalone receive filters. The filters 102 can include at least four duplexers in some applications. According to some other applications, the filters 102 can include at least eight duplexers.

As illustrated, the filters 102 are electrically connected to the antenna switch 104. The antenna switch 104 can be a multi-throw radio frequency switch arranged to electrically connect one or more filters of the filters 102 to an antenna port ANT of the module 100. The antenna switch 104 can include at least eight throws in some applications. In certain applications, the antenna switch 104 can include at least ten throws.

A switch 105 can electrically connect a selected receive filter of the filters to a low noise amplifier 106. The low noise amplifier 106 is arranged to amplify the received radio frequency signal and provide an output to a receive port RX. In some instances, another switch can be electrically coupled between the low noise amplifier 106 and the receive port RX.

The illustrated module 100 also includes a control circuit 107. The control circuit 107 can perform any suitable control functions for the module 100.

Figure 12A:
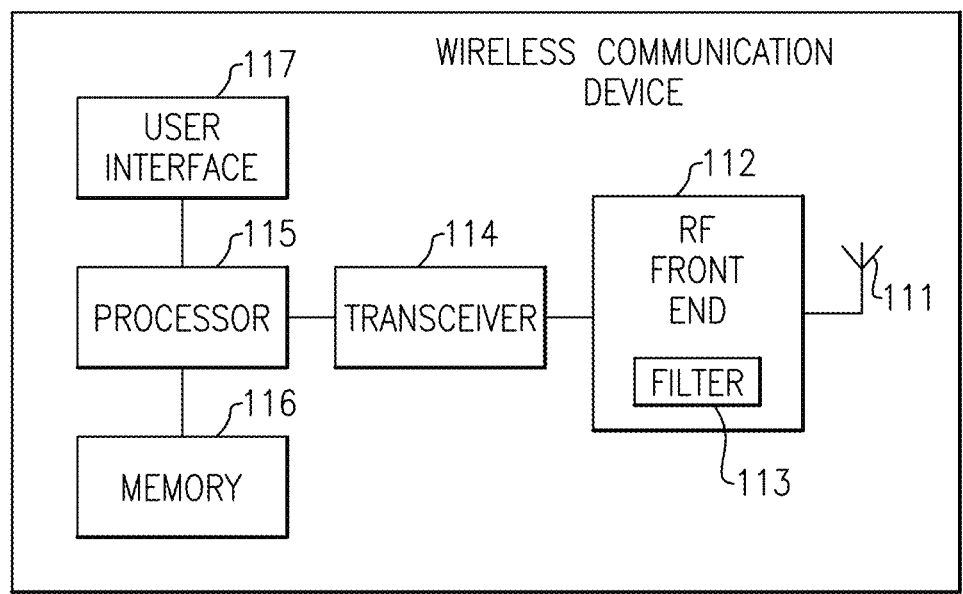
FIG. 12A is a schematic block diagram of a wireless communication device that includes a filter with an acoustic wave device according to an embodiment.

FIG. 12A is a schematic block diagram of a wireless communication device 110 that includes a filter 113 with an acoustic wave device in accordance with one or more embodiments. The wireless communication device 110 can be any suitable wireless communication device. For instance, a wireless communication device 110 can be a mobile phone, such as a smart phone. As illustrated, the wireless communication device 110 includes an antenna 111, an RF front end 112, an RF transceiver 114, a processor 115, a memory 116, and a user interface 117. The antenna 111 can transmit RF signals provided by the RF front end 112. The antenna 111 can provide received RF signals to the RF front end 112 for processing.

The RF front end 112 can include one or more power amplifiers, one or more low noise amplifiers, one or more RF switches, one or more receive filters, one or more transmit filters, one or more duplex filters, one or more filters of a multiplexer, one or more filters of a diplexer or other frequency multiplexing circuit, or any suitable combination thereof. The RF front end 112 can transmit and receive RF signals associated with any suitable communication standard. Any of the acoustic resonators disclosed herein can be implemented in filter 113 of the RF front end 112.

The RF transceiver 114 can provide RF signals to the RF front end 112 for amplification and/or other processing. The RF transceiver 114 can also process an RF signal provided by a low noise amplifier of the RF front end 112. The RF transceiver 114 is in communication with the processor 115. The processor 115 can be a baseband processor. The processor 115 can provide any suitable base band processing functions for the wireless communication device 110. The memory 116 can be accessed by the processor 115. The memory 116 can store any suitable data for the wireless communication device 110. The processor 115 is also in communication with the user interface 117. The user interface 117 can be any suitable user interface, such as a display.

Figure 12B:
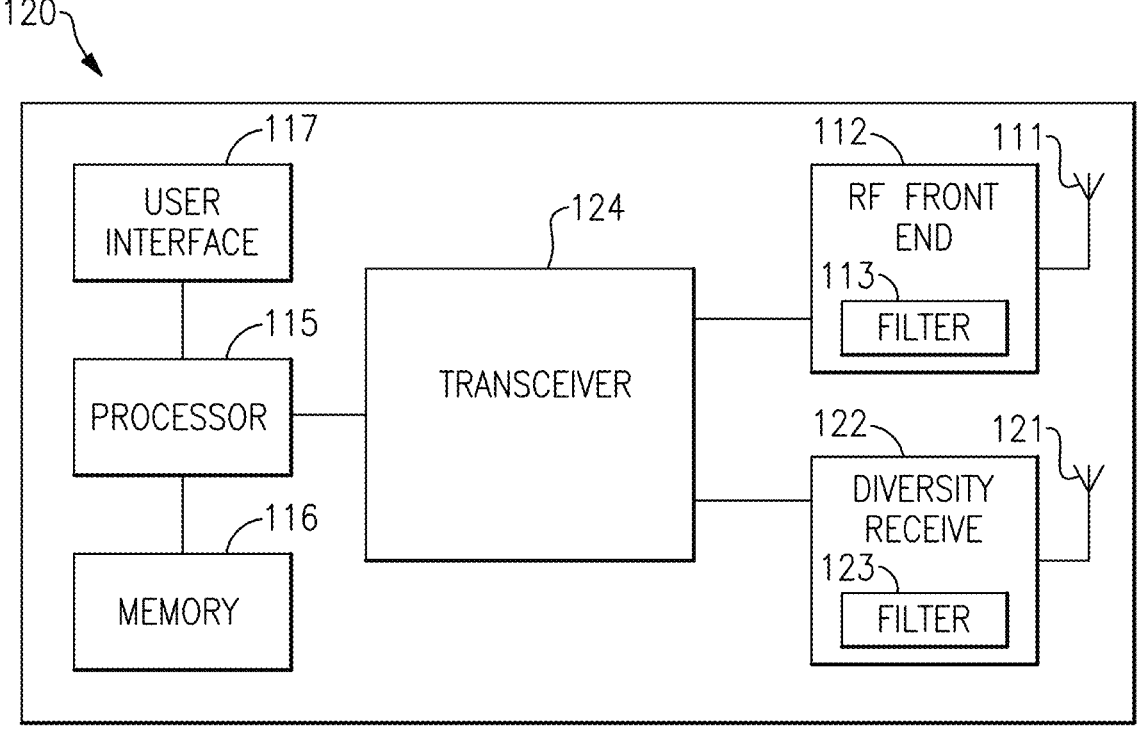
FIG. 12B is a schematic block diagram of a wireless communication device that includes a filter with an acoustic wave device according to another embodiment.

FIG. 12B is a schematic block diagram of a wireless communication device 120 that includes a radio frequency front end 112 with a filter 113 and a diversity receive module 122 with a filter 123 according to an embodiment. The wireless communication device 120 is like the wireless communication device 110 of FIG. 12A, except that the wireless communication device 120 also includes diversity receive features. As illustrated in FIG. 12B, the wireless communication device 120 includes a diversity antenna 121, a diversity module 122 configured to process signals received by the diversity antenna 121 and including filters 123, and a transceiver 124 in communication with both the radio frequency front end 112 and the diversity receive module 122. The filter 103 can include one or more acoustic wave resonators having any suitable IDT electrode disclosed herein. The filter 123 can include any can include one or more acoustic wave resonators having any suitable IDT electrode disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kilohertz (kHz) to 300 gigahertz (GHz), such as in a frequency range from about 450 MHz to 8.5 GHz. An acoustic wave resonator including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of manufacturing a surface acoustic wave resonator, the method comprising:
   forming a support substrate layer;
   cutting a piezoelectric layer of lithium niobate, to form a cut angle defined by first, second and third Euler angles $(\phi_1, \theta_1, \psi_1)$ so that the second Euler angle $\theta_1$ has a value of about $76 < \theta_1 < 86$ degrees, and forming the piezoelectric layer over the support substrate layer to have a height H1 with a value of about $0.3L < H1 < 0.9L$, where L is a pitch between a plurality of fingers of an interdigital transducer electrode; and
   forming the interdigital transducer electrode including the plurality of fingers over the piezoelectric layer.

2. The method of claim 1 wherein forming the support substrate layer includes using a material chosen from the group consisting of quartz, silicon and diamond.

3. The method of claim 2 further comprising cutting an angle on the support substrate layer to form a cut angle defined by first, second and third Euler angles $(\phi_2, \theta_2, \psi_2)$ so that the second Euler angle $\theta_2$ has a value of about $25 < \theta_2 < 70$ degrees.

4. The method of claim 3 wherein the first Euler angle $\phi_1$ of the support substrate layer is 0 degrees and the third Euler angle $\psi_2$ of the support substrate layer is 90 degrees.

5. The method of claim 1 wherein the first Euler angle $\phi_1$ of the piezoelectric layer is 0 degrees and the third Euler angle $\psi_1$ of the piezoelectric layer is 90 degrees.

6. The method of claim 1 wherein the height H1 has a value of about $0.5L < H1 < 0.9L$, where L is a pitch between the plurality of fingers of the interdigital transducer electrode.

7. The method of claim 1 further including forming a functional layer between the piezoelectric layer and the support substrate layer.

8. The method of claim 7 wherein forming the functional layer comprises forming a silicon dioxide layer with a thickness H2 with a value of about $0.3L < H2 < 0.7L$, where L is a pitch between the plurality of fingers of the interdigital transducer electrode.

9. The method of claim 8 wherein the height H1 has a value of about $0.3L < H1 < 0.7L$, where L is the pitch between the plurality of fingers of the interdigital transducer electrode.

10. A method of manufacturing a surface acoustic wave resonator, the method comprising:
    cutting a support substrate layer to form a first cut angle defined by first, second and third Euler angles $(\phi_2, \theta_2, \psi_2)$ so that the second Euler angle $\theta_2$ has a value of about $25 < \theta_2 < 70$ degrees;
    cutting a piezoelectric layer of lithium niobate to form a second cut angle defined by first, second and third Euler angles $(\phi_1, \theta_1, \psi_1)$ so that the second Euler angle $\theta_1$ has a value of about $76 < \theta_1 < 86$ degrees, and forming the piezoelectric layer over the support substrate layer to have a height H1 with a value of about $0.3L < H1 < 0.9L$, where L is a pitch between a plurality of fingers of an interdigital transducer electrode; and
    forming the interdigital transducer electrode including the plurality of fingers over the piezoelectric layer.

11. The method of claim 10 wherein forming the support substrate layer includes using a material chosen from the group consisting of quartz, silicon and diamond.

12. The method of claim 10 wherein the first Euler angle $\phi_1$ of the piezoelectric layer is 0 degrees and the third Euler angle $\psi_1$ of the piezoelectric layer is 90 degrees.

13. The method of claim 10 wherein the height H1 has a value of about 0.5L<H1<0.9L, where L is a pitch between the fingers of the interdigital transducer electrode.

14. The method of claim 10 wherein the first Euler angle $\phi_1$ of the support substrate layer is 0 degrees and the third Euler angle $\psi_2$ of the support substrate layer is 90 degrees.

15. The method of claim 10 further including forming a functional layer between the piezoelectric layer and the support substrate layer.

16. The method of claim 15 wherein the functional layer is a silicon dioxide layer having a thickness H2 with a value of about 0.3L<H2<0.7L, where L is a pitch between the plurality of fingers of the interdigital transducer electrode.

17. The method of claim 16 wherein the piezoelectric layer has a thickness H1 with a value of about 0.3L<H1<0.7L, where L is the pitch between the plurality of fingers of the interdigital transducer electrode.

\* \* \* \* \*